United States Patent
Chiang et al.

(10) Patent No.: US 7,184,336 B2
(45) Date of Patent: Feb. 27, 2007

(54) METHOD AND TEST STRUCTURE FOR EVALUATING THRESHOLD VOLTAGE DISTRIBUTION IN A MEMORY ARRAY

(75) Inventors: Lu-Ping Chiang, Hsinchu (TW); Chien-Min Wu, Hsinchu (TW); Po-An Chen, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 100 days.

(21) Appl. No.: 11/104,421

(22) Filed: Apr. 13, 2005

(65) Prior Publication Data

US 2006/0039212 A1 Feb. 23, 2006

(30) Foreign Application Priority Data

Aug. 18, 2004 (TW) .............................. 93124822 A

(51) Int. Cl.
*G11C 29/00* (2006.01)
(52) U.S. Cl. .................................. 365/201; 365/185.24
(58) Field of Classification Search ........... 365/185.09, 365/185.18, 185.24 X, 185.27, 201 O
See application file for complete search history.

(56) References Cited

U.S. PATENT DOCUMENTS 6,285,588 B1 * 9/2001 Fastow .................. 365/185.19

FOREIGN PATENT DOCUMENTS

JP 06060700 A * 3/1994

* cited by examiner

*Primary Examiner*—VanThu Nguyen
(74) *Attorney, Agent, or Firm*—Birch, Stewart, Kolasch & Birch, LLP.

(57) ABSTRACT

A method for evaluating threshold voltage distribution of memory cells. The method comprises connecting all sources and drains of memory cells in a memory array to a fixed voltage; measuring charge pumping current characteristic of a single memory cell versus a first gate voltage and second gate voltage respectively. The total charge pumping current characteristic of a memory array is then measured versus a first gate voltage and second gate voltage respectively. The charge pumping current characteristics of the single memory cell is compared to that of the memory array to obtain a range of threshold voltage distribution.

11 Claims, 5 Drawing Sheets

METHOD AND TEST STRUCTURE FOR EVALUATING THRESHOLD VOLTAGE DISTRIBUTION IN A MEMORY ARRAY

BACKGROUND

The invention relates to characteristic distribution of memory cells in a memory array and, in particular, to a method for evaluating threshold voltage distribution in a memory array by charge pumping.

In a non-volatile memory, threshold voltage distribution is a key concern for memory performance and reliability. Operation of a memory array is impacted by tail bits (cells with minimum Vth) and head bits (cells with maximum Vth) during cell program and erase operations. Thus, it is very important to use an appropriate method to obtain accurate threshold voltage distribution.

FIG. 1 is a conventional test structure for evaluating threshold voltage distribution in a flash memory. The test structure was disclosed in International Conference on Microelectronic Test Structure by Kenji Hakozaki in March, 1973. The test structure 100 comprises a plurality of memory cells 102 connected in parallel. All sources and drains are commonly connected to a voltage Vs and Vd, respectively, while all gates are commonly connected to a voltage Vcg. When a memory cell 102 is operated in a sub-threshold region, a current thereof is expressed as $Id = \alpha \cdot 10^{(Vcg-Vth)/S}$, wherein Vth is threshold voltage. Accordingly, the current increases exponentially with voltage. A slight Vth difference results in a few decades difference of the current and most of the sub-threshold current is derived from only a few bits which have lower Vth. Thus, the minimum threshold voltage can be derived from sub-threshold characteristics.

Conversely, when a memory cell is operated in a linear region, the current is expressed as $Id = gm(Vcg-Vth-Vd/2)Vd$. The total current of all cells is equal to the product of the mean current by the number of the cells when Vcg is higher than the highest threshold voltage Vth of the measured cells. Thus, the threshold voltage Vth which is estimated from the total Id of all cells is equal to the mean threshold voltage of all cells. In general, the mean threshold voltage is equal to the median threshold voltage of the distribution when the ratio of the tail bits is small.

The conventional method only provides the minimum Vth and/or median Vth of an array from the I-V characteristics. The maximum Vth, however, cannot be extracted from the conventional method. Threshold voltage distribution also cannot be obtained.

SUMMARY

Embodiments of the invention provide threshold voltage distribution by charge pumping. Not only can the minimum and maximum Vth of a memory array be extracted but the threshold distribution can also be obtained.

Embodiments of the invention provide a method for evaluating threshold voltage distribution of memory cells. The method comprises connecting all sources and drains of memory cells in a memory array to a fixed voltage; measuring the charge pumping current characteristic of a single memory cell versus a first gate voltage and second gate voltage respectively; measuring the total charge pumping current characteristic of a memory array versus a first gate voltage and second gate voltage respectively; and comparing the charge pumping current characteristics of the single cell and the memory array to obtain a threshold voltage distribution range.

Embodiments of the invention also provide a test structure for evaluating threshold voltage distribution of memory cells. The test structure comprises a plurality of memory cells, a current meter and a pulse generator. Sources and drains of the memory cells are commonly connected to a fixed voltage. Gates of the memory cells are commonly connected to a first node and a substrate thereof is connected to a second node. The current meter is coupled to the second node to measure a total substrate current. The pulse generator is connected to the first node for providing an electrical pulse.

DETAILED DESCRIPTION

Figure 1:
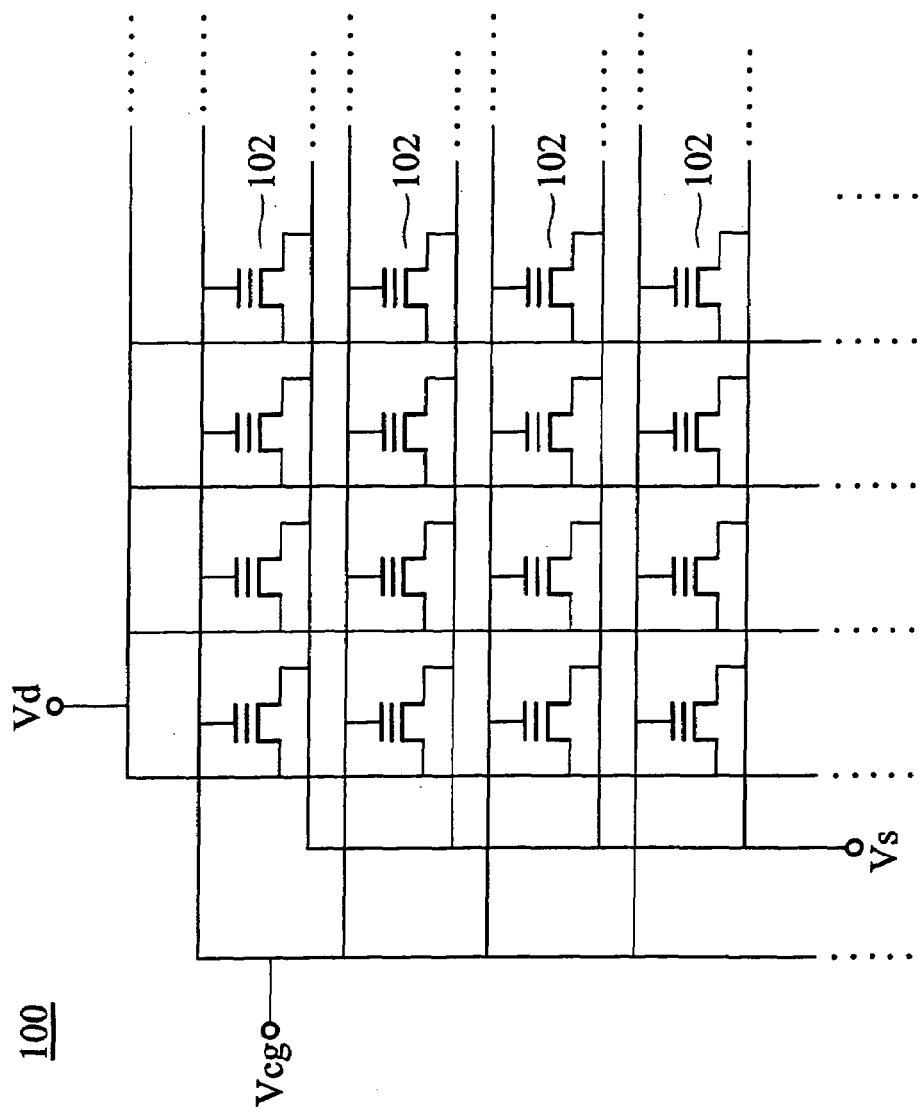
FIG. 1 shows a conventional test structure for evaluating threshold voltage distribution in a flash memory.
Figure 2:
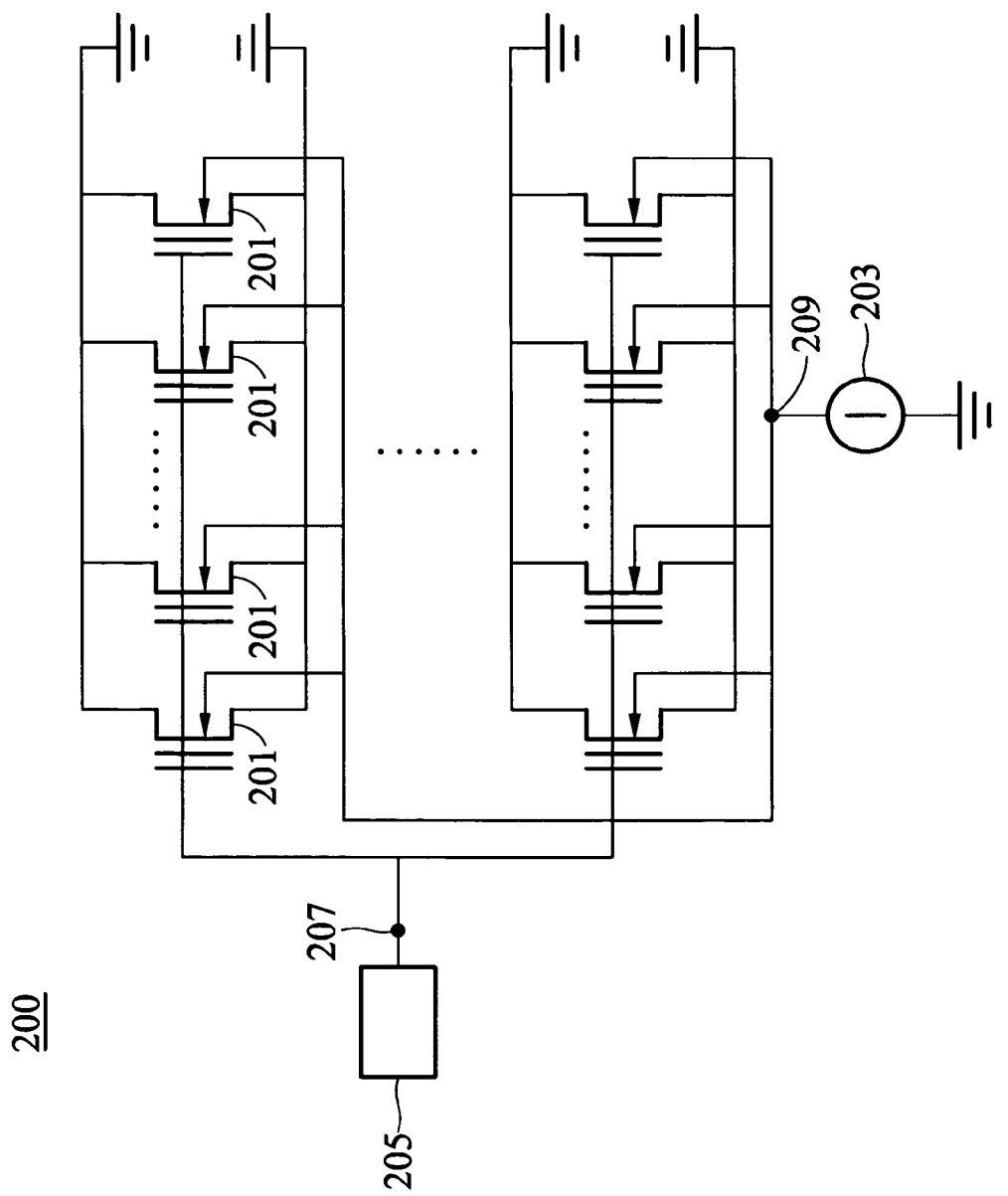
FIG. 2 shows a test structure of an embodiment according to the invention.

FIG. 2 shows a test structure of an embodiment according to the invention. The test structure 200 comprises a plurality of memory cells 201, a current meter 203 and a pulse generator 205. Sources and drains of the memory cells 201 are commonly connected to a fixed voltage. Gates of the memory cells 201 are commonly connected to a first node 207 and a substrate thereof is connected to a second node 209. The current meter 203 is coupled to the second node 209 to measure a total substrate current. The pulse generator 205 is coupled to a first node 207 for providing an electrical pulse. As shown in FIG. 2, the memory cells 201 can be non-volatile memory cells. More specifically, each of the non-volatile cells comprises a floating gate.

Figure 3:
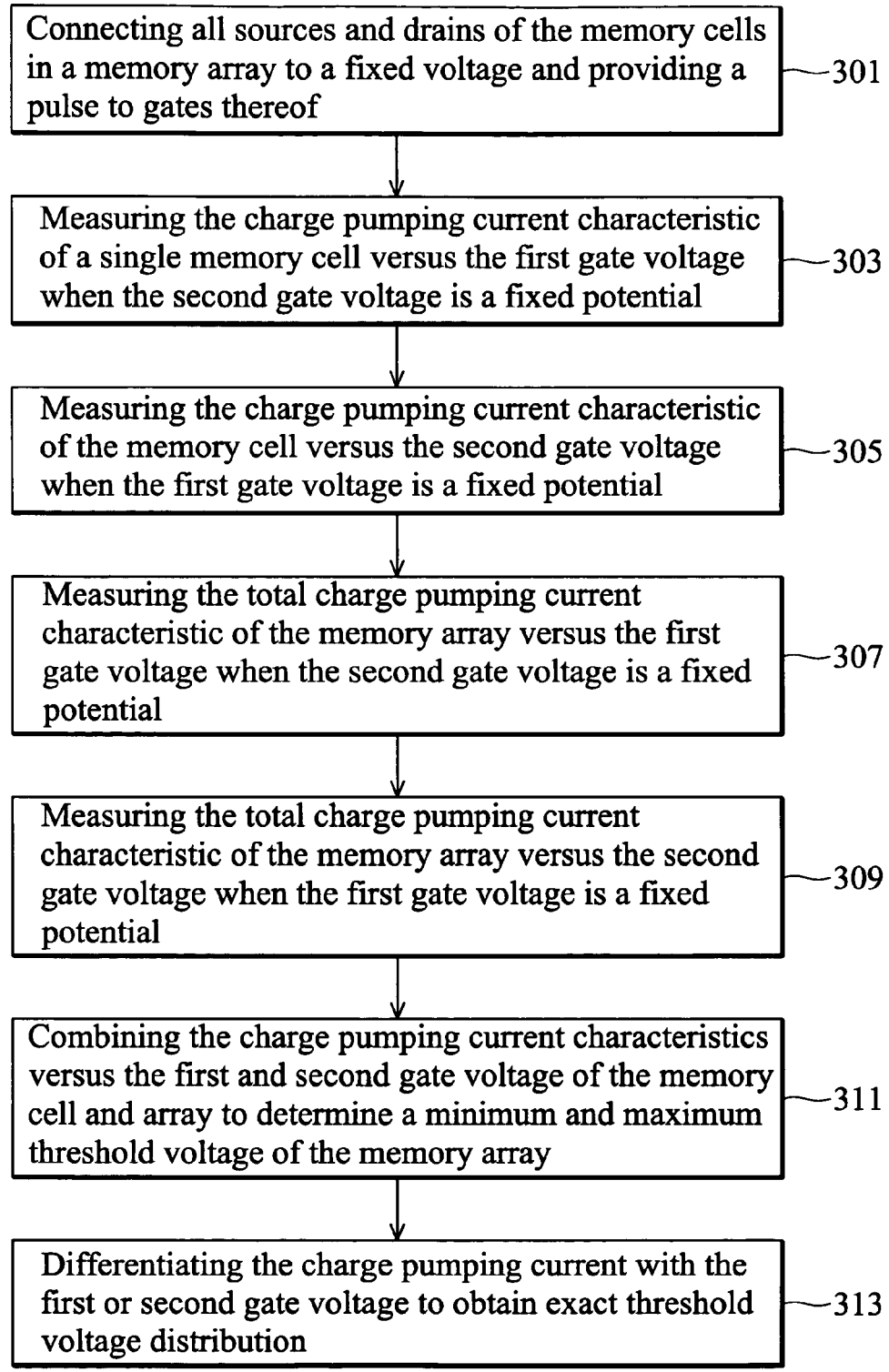
FIG. 3 illustrates a method of another embodiment according to the invention.

Embodiments of the invention provide a method for evaluating threshold voltage distribution of memory cells, as shown in FIG. 3. The method comprises connecting all sources and drains of memory cells in a memory array to a fixed voltage and providing a pulse to gates thereof (step 301); wherein a peak voltage of the pulse is a first gate voltage and a valley voltage of the pulse is a second gate voltage. Preferably, the fixed voltage is a ground potential. Moreover, a frequency of the pulse ranges from 0.1K to 1000K Hertz.

Figure 4:
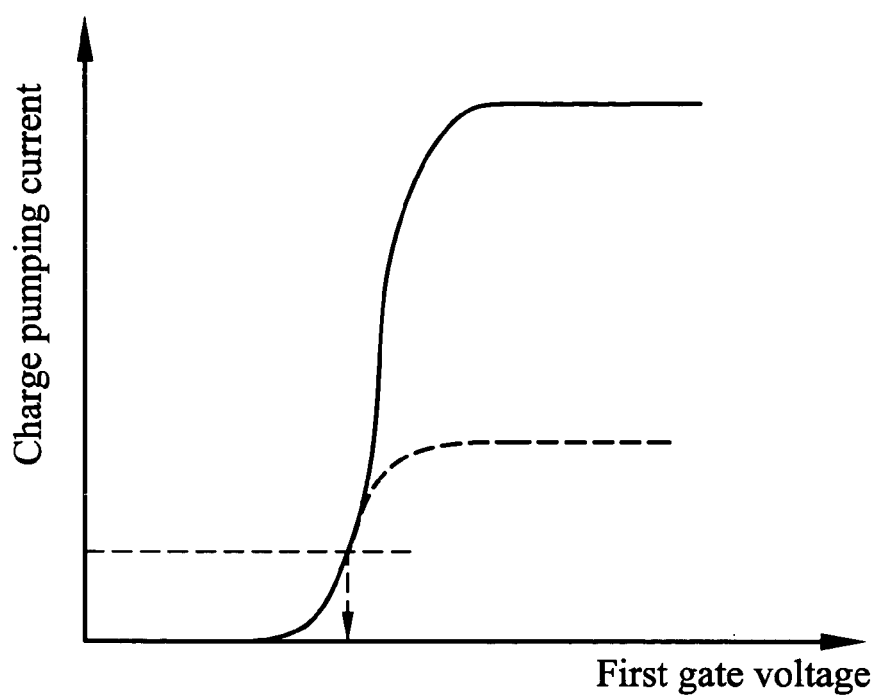
FIG. 4 shows charge pumping current versus a first gate voltage of an embodiment according to the invention.
Figure 5:
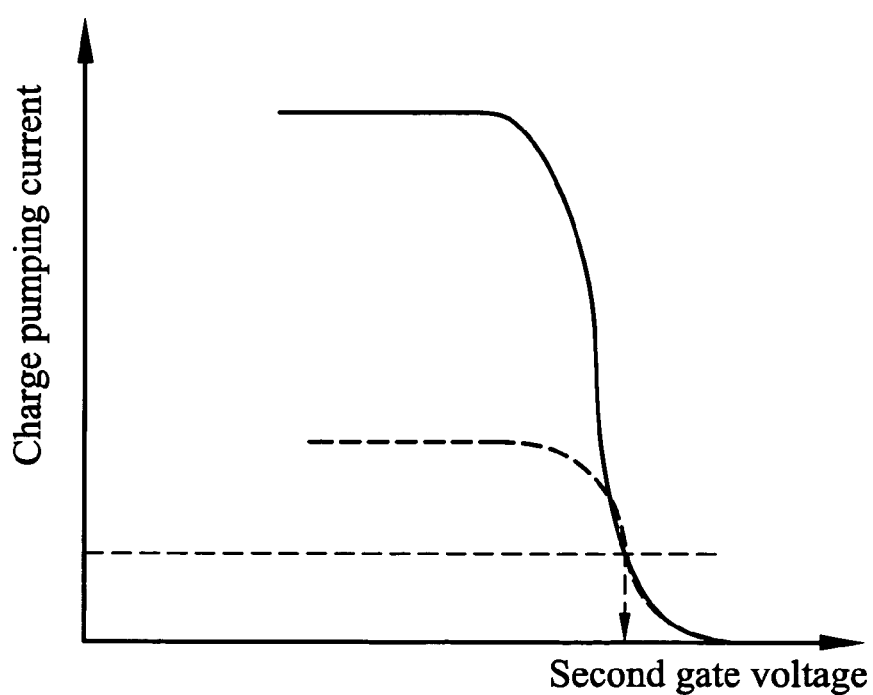
FIG. 5 shows charge pumping current versus a second gate voltage of an embodiment according to the invention.

Then, when the second gate voltage is a fixed potential, the charge pumping current characteristic of a single memory cell versus a first gate voltage is measured (step 303), shown as a dashed curve in FIG. 4. Thereafter, the charge pumping current characteristic of the memory cell versus the second gate voltage is measured when the first gate voltage is a fixed potential (step 305), shown as a dashed curve in FIG. 5. Subsequently, when the second gate voltage is a fixed potential, the total charge pumping current characteristic of the memory array versus the first gate voltage is measured (step 307), shown as a solid curve in FIG. 4, wherein the first gate voltage ranges from a voltage lower than minimum Vth to a maximum voltage. The total charge pumping current characteristic of the memory array versus the second gate voltage is also measured when the first gate voltage is a fixed potential (step 309), shown as a solid curve in FIG. 5, wherein the second gate voltage ranges from a minimum voltage to a maximum voltage. It is noted that a sequence of the steps 303 to 309 is not fixed.

Figure 6:
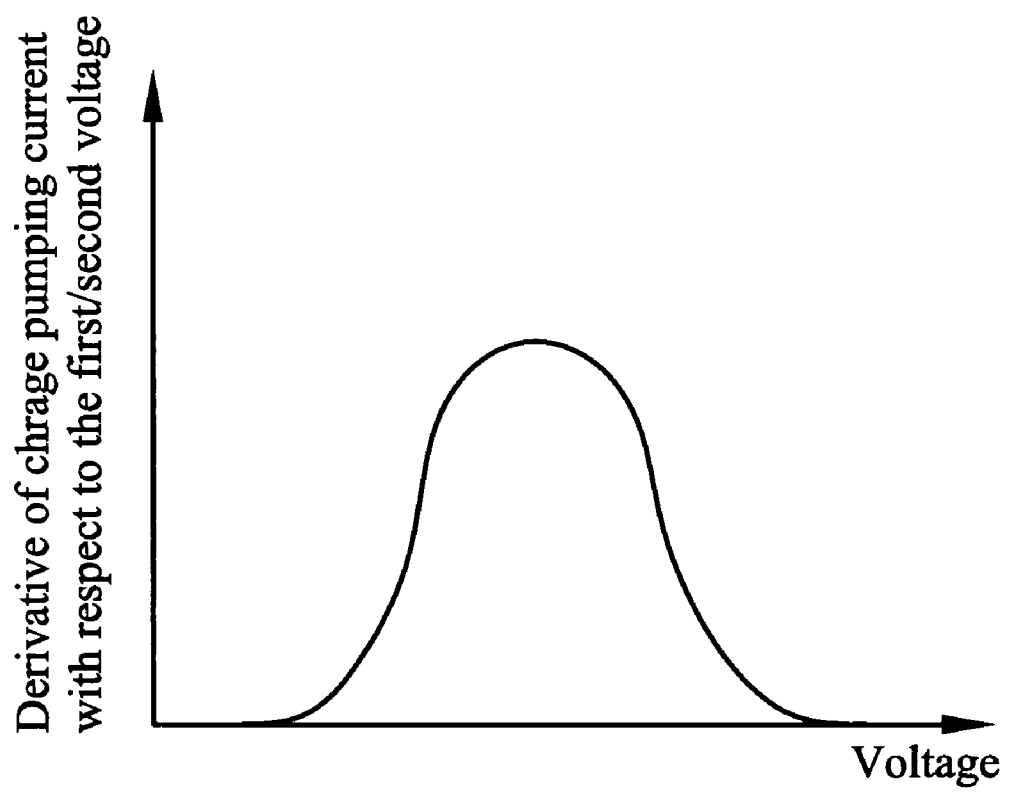
FIG. 6 illustrates threshold voltage distribution obtained through the method illustrated in FIG. 3.

The charge pumping current characteristics of the memory cell and array versus the first and second gate voltage are combined such that a minimum and maximum threshold voltage of the memory array can be determined (step 311). Since a slight difference in the first or second gate voltage results in a difference of charge pumping current, threshold voltage distribution can be obtained by differentiating the charge pumping current with the first or second gate voltage (step 313), as shown in FIG. 6. The sequence of the steps 311 and 313 can be changed. Additionally, the memory cells in the memory array can be non-volatile memory cells. More specifically, each of the non-volatile memory cells comprises a floating gate.

Embodiments of the invention provide a method of obtaining threshold voltage distribution by charge pumping. A minimum and maximum threshold voltage of threshold voltage distribution of the memory cells can be obtained by such a method. The exact threshold voltage distribution can also be extracted. The method according to the invention is simple and suitable for use in wafer acceptance test (WAT). Moreover, no additional circuitry is required.

While the invention has been described by way of example and in terms of preferred embodiment, it is to be understood that the invention is not limited thereto. To the contrary, it is intended to cover various modifications and (as would be apparent to those skilled in the art). Therefore, the scope of the appended claims should be accorded to the broadest interpretation so as to encompass all such modifications.

What is claimed is:

1. A method for evaluating threshold voltage distribution of memory cells, the method comprising:
   connecting all sources and drains of the memory cells in a memory array to a fixed voltage and providing a pulse to gates thereof; wherein a peak voltage of the pulse is a first gate voltage and a valley voltage of the pulse is a second gate voltage;
   measuring the charge pumping current characteristic of a single memory cell versus the first gate voltage when the second gate voltage is a fixed potential;
   measuring the charge pumping current characteristic of the memory cell versus the second gate voltage when the first gate voltage is a fixed potential;
   measuring the total charge pumping current characteristic of the memory array versus the first gate voltage when the second gate voltage is a fixed potential;
   measuring the total charge pumping current characteristic of the memory array versus the second gate voltage when the first gate voltage is a fixed potential; and
   comparing the charge pumping current characteristics of the memory cell and array versus the first and second gate voltage to determine a minimum and maximum threshold voltage of threshold voltage distribution of the memory cells;
   wherein the charge pumping current is a total substrate current of the memory array.

2. The method as claimed in claim 1, further comprising differentiating the charge pumping current with the first or second gate voltage to obtain exact threshold voltage distribution.

3. The method as claimed in claim 1, wherein the fixed voltage is a ground potential.

4. The method as claimed in claim 1, wherein the memory cell is a non-volatile memory.

5. The method as claimed in claim 4, wherein each of the memory cells in the non-volatile memory comprises a floating gate.

6. The method as claimed in claim 1, wherein a frequency of the pulse ranges from 0.1K to 1000K Hertz.

7. A test structure for evaluating threshold voltage distribution of memory cells, comprising:
   a plurality of memory cells with sources and drains commonly connected to a fixed voltage, gates commonly connected to a first node, and a substrate thereof connected to a second node;
   a current meter coupled to the second node for measuring a total substrate current; and
   a pulse generator connected to the first node for providing an electrical pulse to the gates of the memory cells;
   wherein a peak voltage of the pulse is a first gate voltage and a valley voltage of the pulse is a second gate voltage.

8. The test structure as claimed in claim 7, wherein the fixed voltage is a ground potential.

9. The test structure as claimed in claim 7, wherein the memory cell is a non-volatile memory.

10. The test structure as claimed in claim 9, wherein each of the memory cells in the non-volatile memory comprises a floating gate.

11. The test structure as claimed in claim 7, wherein through the current meter, the charge pumping current characteristic of a memory cell and array versus the first gate voltage is measured when the second gate voltage is a fixed potential and the charge pumping current characteristic of a memory cell and array versus the second gate voltage is measured when the first gate voltage is a fixed potential.

* * * * *